US012419023B2

(12) United States Patent
Tudman et al.

(10) Patent No.: US 12,419,023 B2
(45) Date of Patent: Sep. 16, 2025

(54) APPARATUS, SYSTEM, AND METHOD OF PROVIDING A DISPENSER OF CIRCUIT BOARD COMPONENT UNDERFILL

(71) Applicant: JABIL INC., St. Petersburg, FL (US)

(72) Inventors: Mark Tudman, St. Petersburg, FL (US); Rayce Loftin, St. Petersburg, FL (US)

(73) Assignee: JABIL INC.

( * ) Notice: Subject to any disclaimer, the term of this patent is extended or adjusted under 35 U.S.C. 154(b) by 643 days.

(21) Appl. No.: 17/420,400

(22) PCT Filed: Dec. 19, 2019

(86) PCT No.: PCT/US2019/067309
§ 371 (c)(1),
(2) Date: Jul. 2, 2021

(87) PCT Pub. No.: WO2020/142226
PCT Pub. Date: Jul. 9, 2020

(65) Prior Publication Data
US 2022/0087083 A1    Mar. 17, 2022

Related U.S. Application Data

(60) Provisional application No. 62/788,511, filed on Jan. 4, 2019.

(51) Int. Cl.
*H05K 13/04* (2006.01)
*B05B 12/12* (2006.01)
(Continued)

(52) U.S. Cl.
CPC ....... *H05K 13/0469* (2013.01); *B05B 12/124* (2013.01); *B05B 13/0431* (2013.01); *B05B 15/14* (2018.02)

(58) Field of Classification Search
CPC . B05B 12/124; B05B 12/145; B05B 13/0431; B05B 15/14
See application file for complete search history.

(56) References Cited

U.S. PATENT DOCUMENTS 5,429,682 A * 7/1995 Harlow, Jr. ........ G05B 19/4182
118/712
7,105,058 B1 * 9/2006 Sinyagin ............... B05B 5/1691
118/62

(Continued)

FOREIGN PATENT DOCUMENTS

CN    103137523    6/2013
CN    104640641    5/2015
(Continued)

OTHER PUBLICATIONS

EPO Communication pursuant to Article 94(3) issued in App. No. EP20190907029, dated Aug. 18, 2023, 5 pages.

(Continued)

*Primary Examiner* — Dah-Wei D. Yuan
*Assistant Examiner* — Stephen A Kitt
(74) *Attorney, Agent, or Firm* — Riverside Law LLP (57) ABSTRACT

An apparatus, system and method for dispensing underfill to components on a printed circuit board. The apparatus, system, and method includes a dispensing end effector suitable for dispensing underfill to components on a printed circuit board within an underfill chamber. The dispensing end effector may include: an electromechanical connection to at least one dispensing robot arm capable of physically situating the dispensing proximate to the circuit board; a communicative connection to a dispense controller capable of communicatively controlling at least the dispensing; a dispenser which includes an underfill output port, which is capable of the dispensing, and which is removably mounted (Continued)

to the electromechanical association; and a protective enclosure at least substantially about the dispenser.

23 Claims, 12 Drawing Sheets

(51) Int. Cl.
 *B05B 13/04* (2006.01)
 *B05B 15/14* (2018.01)

(56) References Cited

U.S. PATENT DOCUMENTS

| | | | |
|---|---|---|---|
| 2003/0137080 A1* | 7/2003 | Bouras | B05C 11/1015 |
| | | | 264/272.17 |
| 2008/0057180 A1* | 3/2008 | Weiss | H05K 3/1241 |
| | | | 427/8 |
| 2014/0079871 A1 | 3/2014 | Lu | |
| 2014/0183248 A1 | 7/2014 | Babiarz et al. | |
| 2016/0052007 A1* | 2/2016 | Fuller | A47K 5/1217 |
| | | | 222/638 |
| 2018/0238923 A1 | 8/2018 | Abe | |

FOREIGN PATENT DOCUMENTS

| | | |
|---|---|---|
| EP | 2639824 | 9/2013 |
| EP | 2972133 A1 | 1/2016 |
| EP | 3296069 | 3/2018 |
| JP | 2015-231044 A | 12/2015 |
| KR | 10-0729838 B1 | 6/2007 |
| KR | 729838 B1 * | 6/2007 |
| KR | 10-1171985 B1 | 8/2012 |

OTHER PUBLICATIONS

International Search Report and Written Opinion issued on Apr. 22, 2020 in PCT/US2019/067309.

* cited by examiner

APPARATUS, SYSTEM, AND METHOD OF PROVIDING A DISPENSER OF CIRCUIT BOARD COMPONENT UNDERFILL

CROSS-REFERENCE TO RELATED APPLICATIONS

The present application claims benefit of priority to U.S. Provisional Application No. 62/788,511, filed Jan. 4, 2019, entitled: "Apparatus, System and Method of Providing a Dispenser of Circuit Board Component Underfill," the entirety of which is incorporated herein by reference as if set forth in its entirety.

BACKGROUND

Field of the Disclosure

The disclosure relates generally to circuit board manufacturing, and, more particularly, to an apparatus, system, and method of providing underfill on a circuit board.

Background of the Disclosure

In a typical printed circuit board production process, numerous steps must be performed in order to complete the subject board. In short, these steps typically include the placement of solder on the board adjacent and along the existing printed circuit traces; the picking and placement of circuit components onto the solder, wherein such components may include, by way of example, resistors, capacitors, inductors, transistors, diodes, integrated circuit chips, and the like; reflow such that the placed board components are secured to and electrically associated with the printed circuit traces; and the underfill of the placed components to provide mechanical support to the components.

However, the underfill process suffers from enhanced difficulty for larger boards, and least because it becomes difficult to access the components on a large board to underfill those components, and further because, as underfill is the result, in most processes, of a capillary action by which the underfill flows under the component in the presence of heat. There are no known processes by which such heat can be consistently applied to large boards, particularly for large boards of odd shapes, prior to crosslinking by the underfill. There are also no known methodologies by which heat contamination within an underfill chamber can be prevented from causing crosslinking of the underfill while still within the underfill dispenser. Upon crosslinking by the underfill, the underfill will no longer move into the empty space beneath the components via the referenced capillary action, and if the crosslinking occurs while the underfill is still within the dispenser, clogging occurs such that the undefill cannot be properly dispensed.

SUMMARY OF THE DISCLOSURE

The disclosure is and includes at least an apparatus, system and method for dispensing underfill to components on a printed circuit board. The apparatus, system, and method includes a dispensing end effector suitable for dispensing underfill to components on a printed circuit board within an underfill chamber. The dispensing end effector may include: an electromechanical connection to at least one dispensing robot arm capable of physically situating the dispensing proximate to the circuit board; a communicative connection to a dispense controller capable of communicatively controlling at least the dispensing; a dispenser which includes an underfill output port, which is capable of the dispensing, and which is removably mounted to the electromechanical association; and a protective enclosure at least substantially about the dispenser.

BRIEF DESCRIPTION OF THE DRAWINGS

The disclosure is illustrated by way of example and not limitation in the accompanying drawings, in which like references may indicate similar elements, and in which.

DETAILED DESCRIPTION

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

Processor-implemented modules, systems and methods of use are disclosed herein that may provide access to and transformation of a plurality of types of digital content, including but not limited to video, image, text, audio, metadata, algorithms, interactive and document content, and which track, deliver, manipulate, transform and report the accessed content. Described embodiments of these modules, systems and methods are intended to be exemplary and not limiting. As such, it is contemplated that the herein described systems and methods may be adapted and may be extended to provide enhancements and/or additions to the exemplary modules, systems and methods described. The disclosure is thus intended to include all such extensions.

Figure 1:
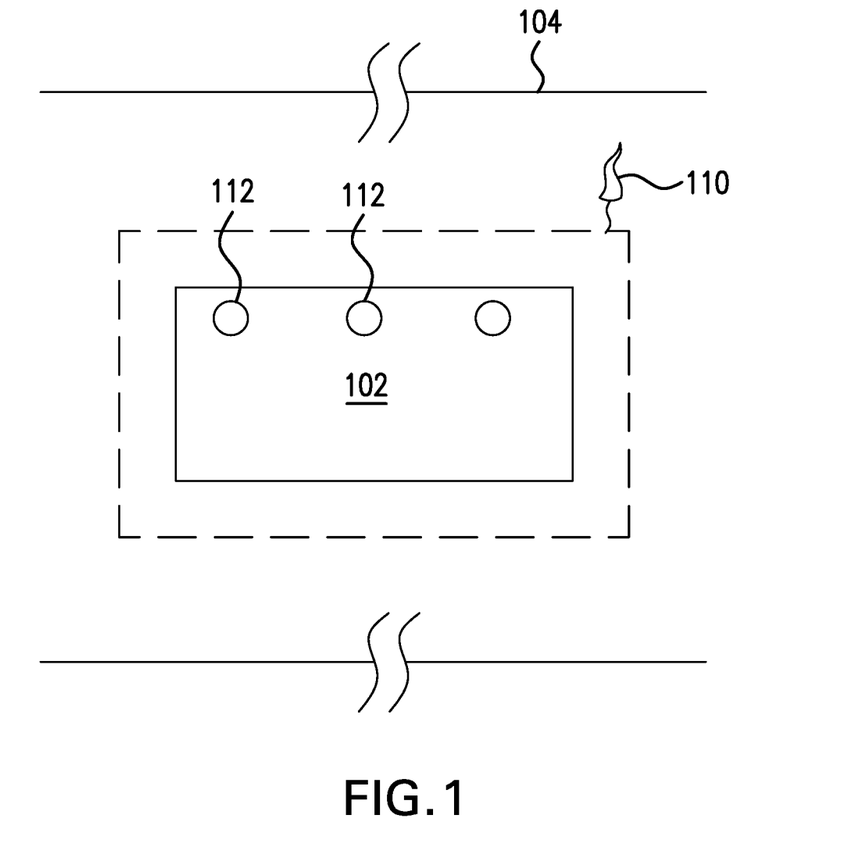
FIG. 1 illustrates a circuit board component.

FIG. 1 illustrates the top view of a component 102 placed onto a printed circuit board 104. The component has, underfilled beneath the component and at least partially extending outside the outermost perimeter 106 of the component from a top view, an under-fill 110. The under-fill 110 is generally placed, in part, because solder joints 112 formed by the reflowed solder to hold the component 102 to the board 104 do not provide sufficient mechanical strength to hold the component 102 sturdily and operably in place on the board 104. The under-fill 110 beneath the component 102 and adjacent to the solder joints 112 provides this mechanical stability.

Figure 2:
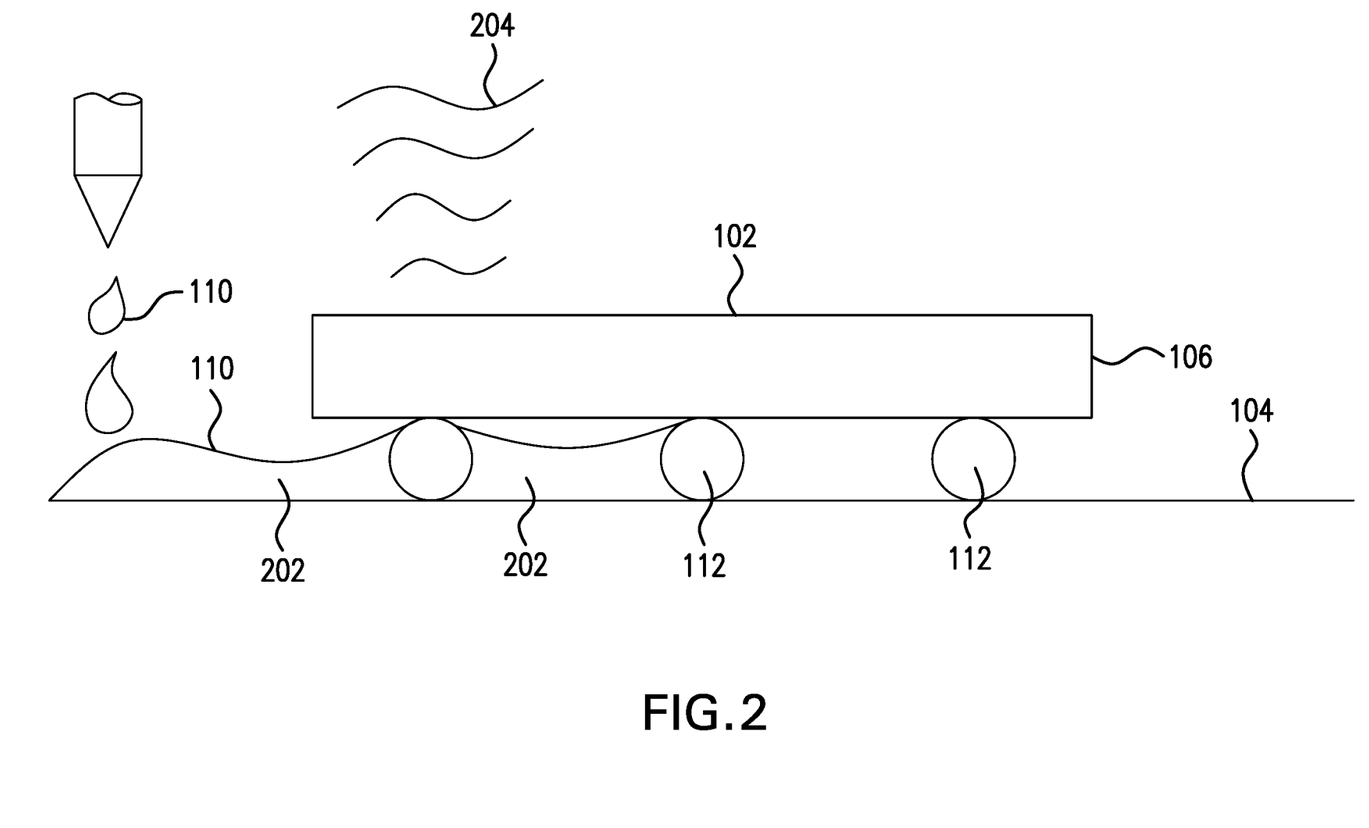
FIG. 2 illustrates capillary action for an underfilled component.

FIG. 2 illustrates a capillary action 202 of an under-fill 110 such that the underfill 110 flows to support a board component 102. In the illustration, about the perimeter 106 of the component 102 and adjacent to the reflow solder joints 112, the under-fill 110 fills in by capillary action 202. Application of heat 204 causes this creeping flow of the under-fill 110 by the capillary action 202 in the example shown. This creeping flow fills underneath the component 102 and into the gaps beneath and around the component 102, between the component 102 and the board 104 on which it resides, and around the connectors by which the component 102 communicates with the board's traces through the solder joints 112. Of note, it is typical that several applications of the under-fill 110 may be needed in order to sufficiently fill the under-component gaps such that the requisite mechanical stability is provided to the component 102 in its location on the subject board 104.

The various aforementioned aspects of under-fill 110, namely, the providing of under-fill material upon the application of heat 204 that enables the capillary action 202 of the underfill 110, are particularly difficult for larger size boards, as referenced above. This is, in part, because prior art under-fill machines have needed to be significantly bigger than the board placed therein, in order to allow for the referenced electromechanical components of the underfill machine to perform the various under-fill and heating functions described herein. Therefore, the larger board, the more the aforementioned issues of providing heat and underfill are exacerbated.

Thus, the embodiments provide an apparatus, system, and method for an under-fill machine that accommodates circular boards of up to 48 inches or more in diameter to provide underfill to the components thereon. Accordingly, accommodated boards in the embodiments may also be smaller than 48 inches, such as 34 inches, 38 inches, or 42 inches, and the disclosed teachings may also be applied to boards larger than 48 inches, such as 52 inches, 54 inches, or 56 inches, by way of nonlimiting example.

Figure 3:
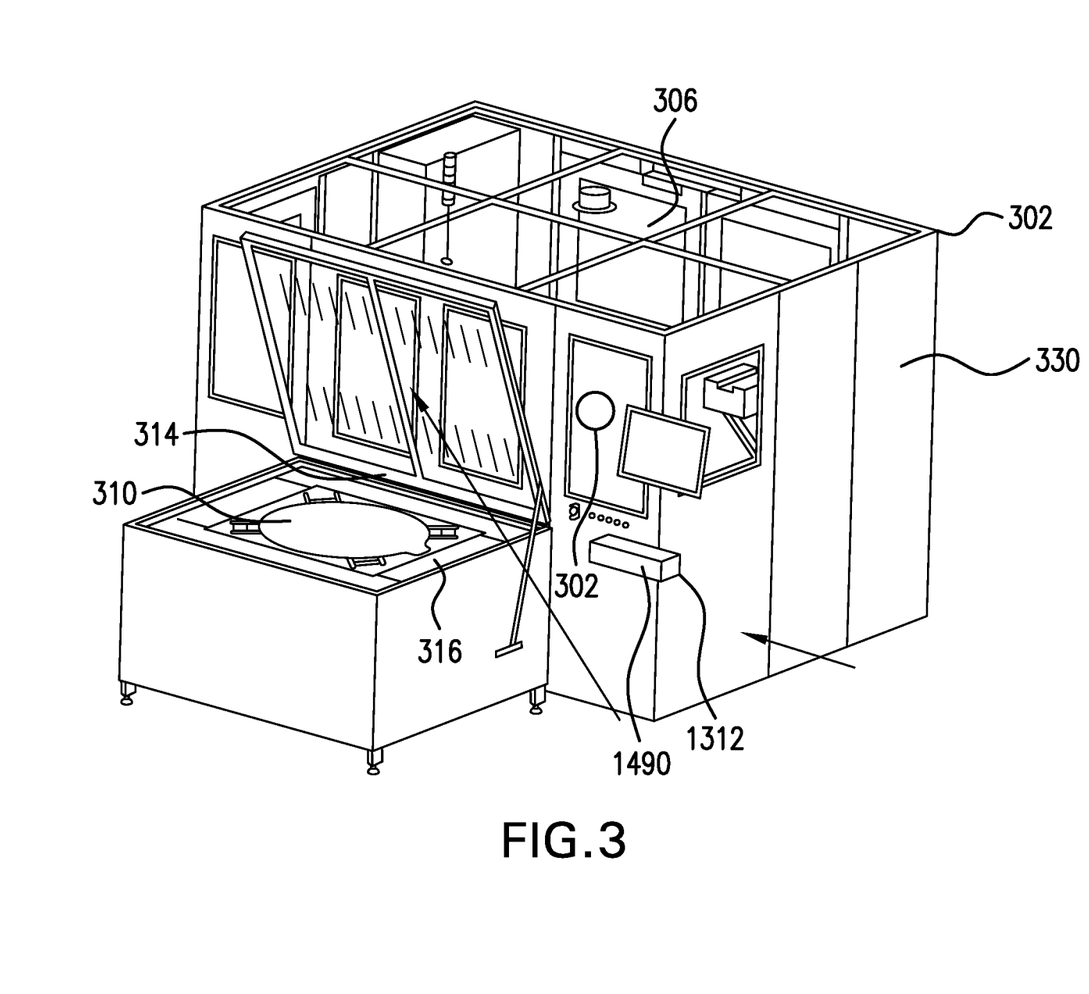
FIG. 3 illustrates and underfill machine.

FIG. 3 illustrates an under-fill machine 302. In the illustration, electromechanical/robotic elements 304 for the providing of at least underfill may be present within an underfill chamber 306, such as two such robots to the right and left sides of the front aspect of the machine 302. These robots 304 may be controlled by software 1490 executed by at least one processing system 1312, and this software 1490 may comprise algorithms that allow for training of the robots 304 to provide underfill in various contexts and to various components; that allow for the providing of this underfill; and for collision avoidance, such as in embodiments wherein the board 310 is sufficiently large so as to require the use of multiple robots 304 to provide underfill in multiple areas of the board 310 simultaneously, so that the robots 304 do not collide when transmitting their respective algorithmic paths.

Also included, such as at the front aspect of the machine 302, may be an accommodating input 314 of suitable size to allow for insertion into the machine 302 of a printed circuit board 310, such as the larger boards discussed throughout. Of note, the accommodating input 314 may allow for placement of the subject board 310 onto a carrier 316 prior to and/or upon insertion to the input 314, such that a printed circuit board 310 may or may not reside on the carrier 316 prior to and/or throughout the under-fill process, as discussed further herein. Additionally, the accommodating input 314 may receive the board 310 and/or the carrier 316 on which the board 310 resides via any known methodologies, such as manually or automatically, such as indexed or unindexed, and/or through the use of an input slide, shuttle or an input conveyor, by way of nonlimiting example.

Figure 4:
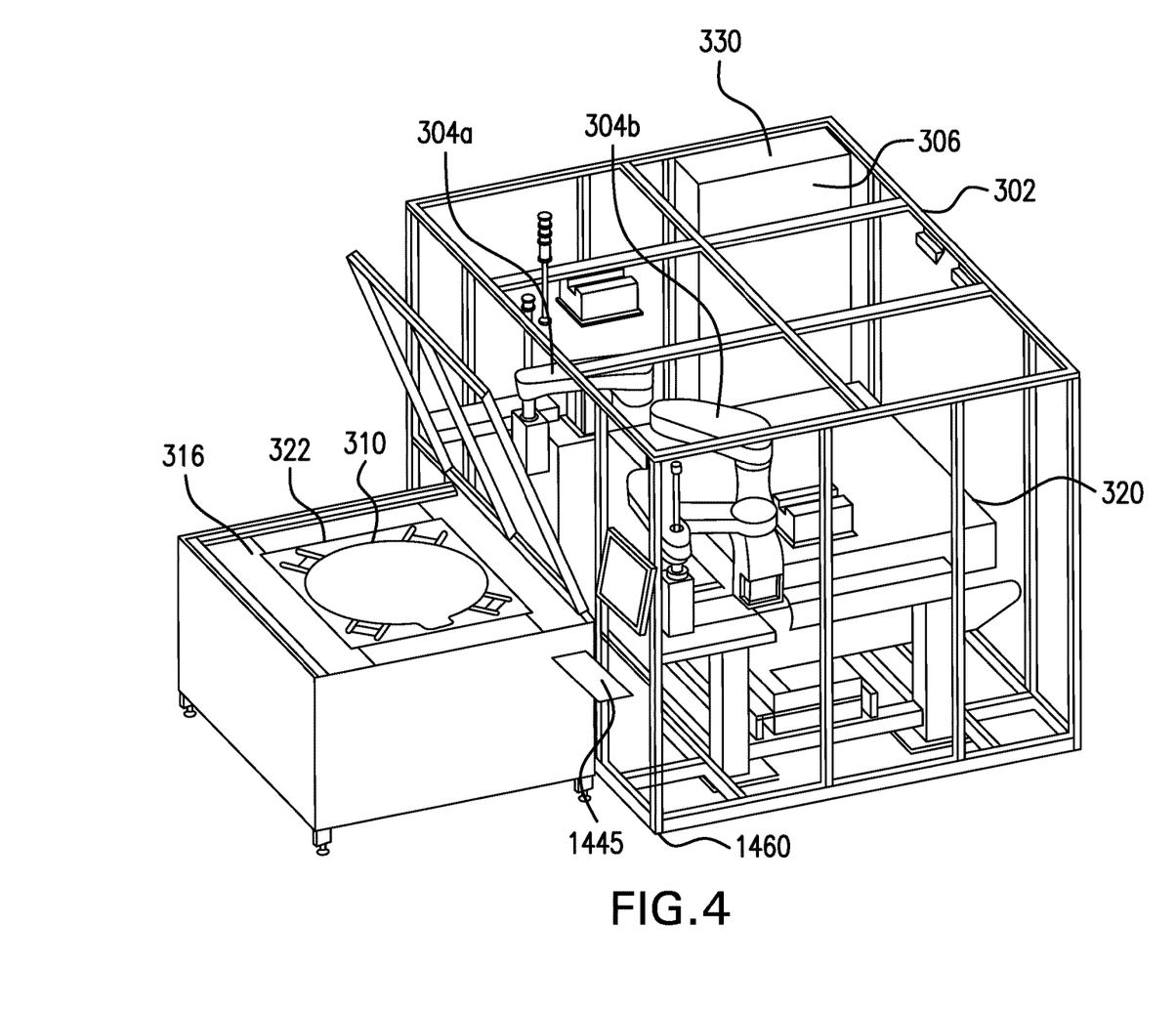
FIG. 4 illustrates and underfill machine.

Now also with respect to FIGS. 3 and 4, the chamber 306 of the under-fill machine 302 may include, proximate to the robots 304 and by way of nonlimiting example, one or more heat sources to heat the board, such as an overhead heat source 320 and a lower heat source 322. The lower heat source 322 may include, by way of nonlimiting example, heating one or more aspects of the board 310, or the entirety of the board 310, from the underside of the board 310, such as by heating, or providing heat from, the carrier 316 with which the board 310 is associated. This lower heat may be provided to the board 310 and/or to or from the carrier 316 via any known methodology, such as forced air heating, IR heating, or RF/inductive heating, by way of non-limiting example. It may be desirable in some embodiments that the lower heat provided be at least substantially uniform over that portion of the board 310 to which the heat is provided.

The overhead heater 320 may be in the style of an oven, such as wherein the provided overhead translates through a medium, such as air or other gas, to the topmost portion of any aspect of the board 310 that is adjacent the overhead heater 320. As such, the provided overhead heat may be of any known type, such as forced air heat, RF/inductively generated heat, and so on. Of note, in embodiments, the overhead heater 320 may only be of sufficient size to accommodate approximately half the circuit board 310 thereunder, such that the circuit board 310, whether or not associated with the carrier 316, may be rotated to place aspects previously unheated underneath the overhead heater 320, such as one portion of the board 310 at a time. This rotation to be subjected to the overhead heater 320 may be performed manually or automatically, as discussed throughout, and is referenced herein throughout as underfill heat indexing.

The foregoing indexing and heating may be subjected to control by the aforementioned processing system 1312. As evident from FIGS. 3, 4, and 5, operator display and control 1445, 1460 may be safely located outside of the under-fill machine 302, such as at the front portion thereof, and in communication with the processing system 1312. Further, an input/output "cabinet" 330 may be provided for user access safely at the rear of the machine 302 as shown, such as to the processing system 1312 and/or electromechanical aspects of the machine 302. This display and control 1445, 1460 may additionally allow for oversight of the calibration aspects discussed throughout, or may be communicative with one or more secondary stations at which the calibrations discussed throughout are carried out.

Figure 5:
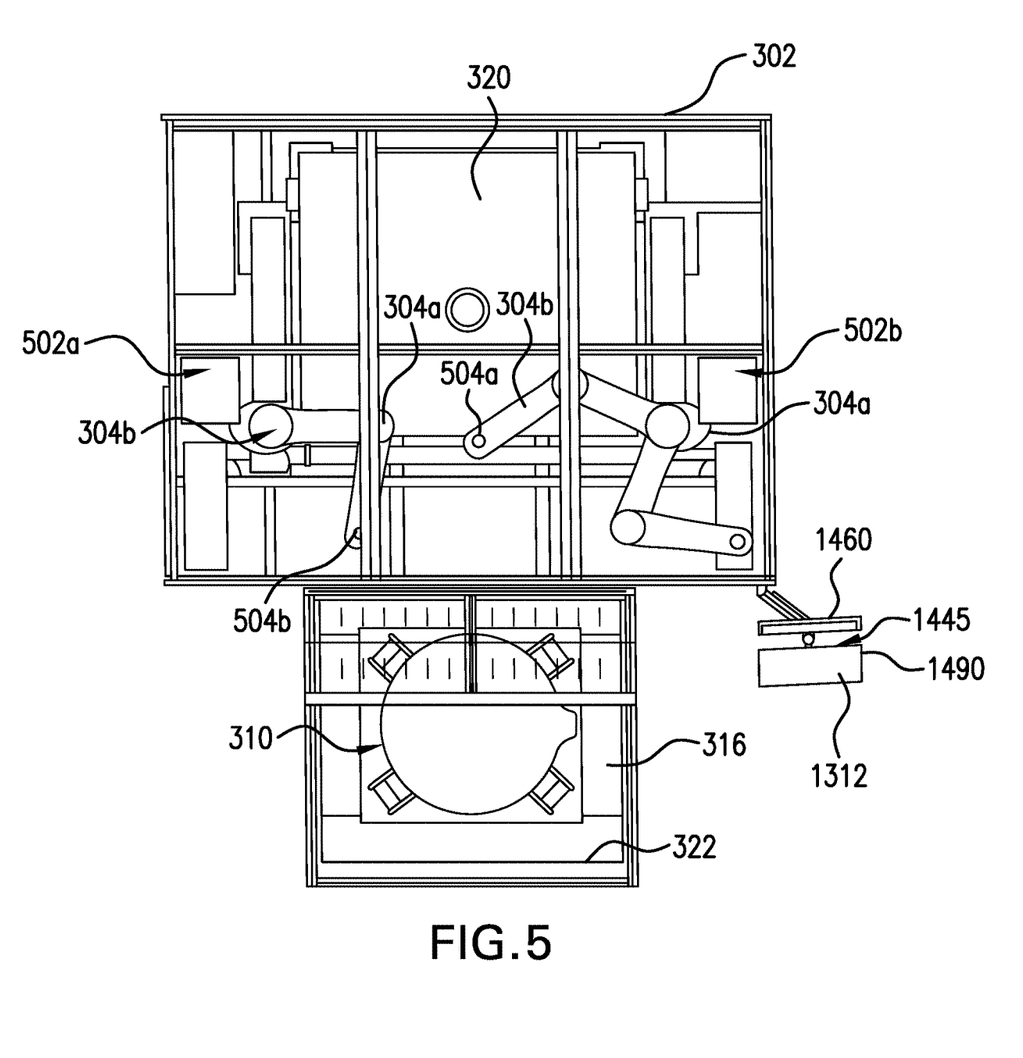
FIG. 5 illustrates and underfill machine.

With particular reference to FIG. 5, the referenced right and left robots 304a, 304b are shown at the front aspect of the illustrated under-fill machine 302. Also shown is a circuit board 310 placed upon a carrier 316 at the front of the machine 302 in preparation for insertion into the accommodating input 314. Of note, the carrier 316 shown, when placed in communication with certain electronic elements, may cause the carrier 316 to serve as the lower heater 322 discussed throughout.

Also shown in FIG. 5 are left and right dispense controllers 502a, 502b that allow, such as via one or more communicative connections, for execution of the dispensing of under-fill by the dispensing heads 504a, 504b associated, such as by one or more electromechanical connections, with each of the right and left robots 304a, 304b. Upon dispensing of the under-fill to components on the circuit board 310, the circuit board components may be subjected to capillary action of the under-fill due to the heating of at least the lower heater 322 discussed throughout, and, in some embodiments, indexing of the board 310 to subject the ones of the components to the overhead heater 320. Further, in certain embodiments, components on certain aspects of the board 310 may be subjected to the overhead heater 320 for preheating, and then indexed out of the overhead heater 320 to be subjected to the dispensing heads 504a, 504b. And yet further, in some embodiments, underfill may be provided, and capillary action caused by the lower heater 322, and thereafter aspects of the board 310 may be indexed into association with the overhead heater 320 for purposes of curing, by way of non-limiting example.

More particularly with respect to FIG. 5, several motor controls may be provided for each robot, such as in conjunction with the dispense controllers 502a, 502b. Such motor controls and dispense controls may be actuated in accordance with the predetermined programs/recipes 1490 executed by the processing system 1312, and/or such actuation may be modified by an operator interacting with the processing system 1312, such as an operator interfacing with the operator display and control 1445, 1460 discussed herein.

Of note, the robotics 304a, 304b shown may include, attached thereto, one or more end-effectors that are and/or include dispense heads 504a, 504b to perform the functions discussed throughout upon the exposed portions, i.e., those portions not underneath the overhead heater 320, of the printed circuit board 310. That is, the end effector associated with the robots may be or include any type of dispensing head 504a, 504b, by way of non-limiting example, capable of dispensing the underfill in accordance with recipe 1490, as discussed above. Moreover, both the robot 304 and the dispensing head(s) 504 may be under the control of the disclosed processing system 1312 executing the recipe 1490.

Further, the left and right robots 304a, 304b discussed herein as operating dispense heads 504a, 504b have ease of access to operate on the upper facing portion of the circuit board 310 that is indexed into physical proximity with the operative area within the chamber of robots 304a, 304b, as will be understood to the skilled artisan in light of the discussion herein. Thereby, indexing portions of the board 310 outside of any overhead heater 320 allows for application of underfill, as discussed throughout, by the robot(s) 304a, 304b via dispense heads 504a, 504b. And after the application of underfill, indexing/rotation of that radial portion under a secondary heater, such as the overhead heater 320, may enhance capillary action, and/or may provide curing of board components and/or underfill, by way of non-limiting example.

The staged indexing of the board into a primary or secondary heater, such as a secondary heater in the form of overhead heater 320, such as for the disclosed underfill process, promotes process stability. For example, the disclosed robotics 304 may operate the dispense heads 504 on only an aspect of the board at a given time, such as working on only a quadrant of a circular board at a given time as discussed above, while the remainder of the board may be cured, preheated, or subjected to temperature maintenance, by the combination of the secondary heater 320 and/or any primary heater 322.

Figure 6:
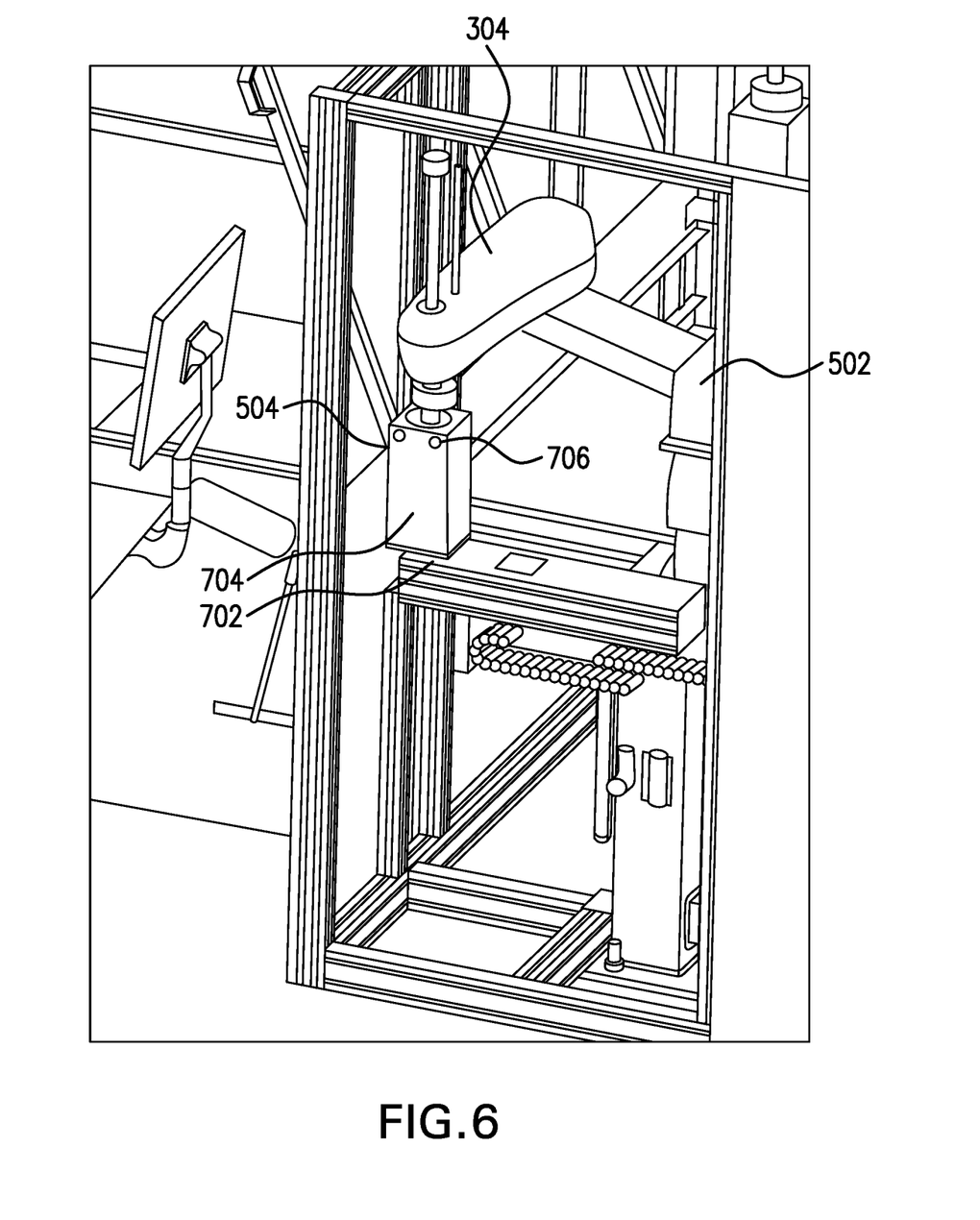
FIG. 6 illustrates an underfill dispenser.

More particularly and as illustrated in FIG. 6, the dispensing of underfill 702 may be performed by each end effector/dispense head 504 associated with the end of the robot arms 304 distal to dispense controllers 502. As shown, the underfill end effector/dispense head 504 may be self-contained 704, such as may include heating and cooling features 706 which help to prevent the underfill 702 to be dispensed from curing or otherwise hardening before it can be suitably dispensed from dispense head 504 onto the circuit board. That is, the heat provided by, by way of non-limiting example, at least one heater, such as the lower and overhead heaters 322, 320 discussed herein, to the extent such heat escapes into the chamber of an underfill machine in which dispenser heads 504 reside, may cause a curing/crosslinking of the underfill 702, in whole or in part, before the underfill 702 is dispensed from the illustrated end effector 504.

Figure 7A:
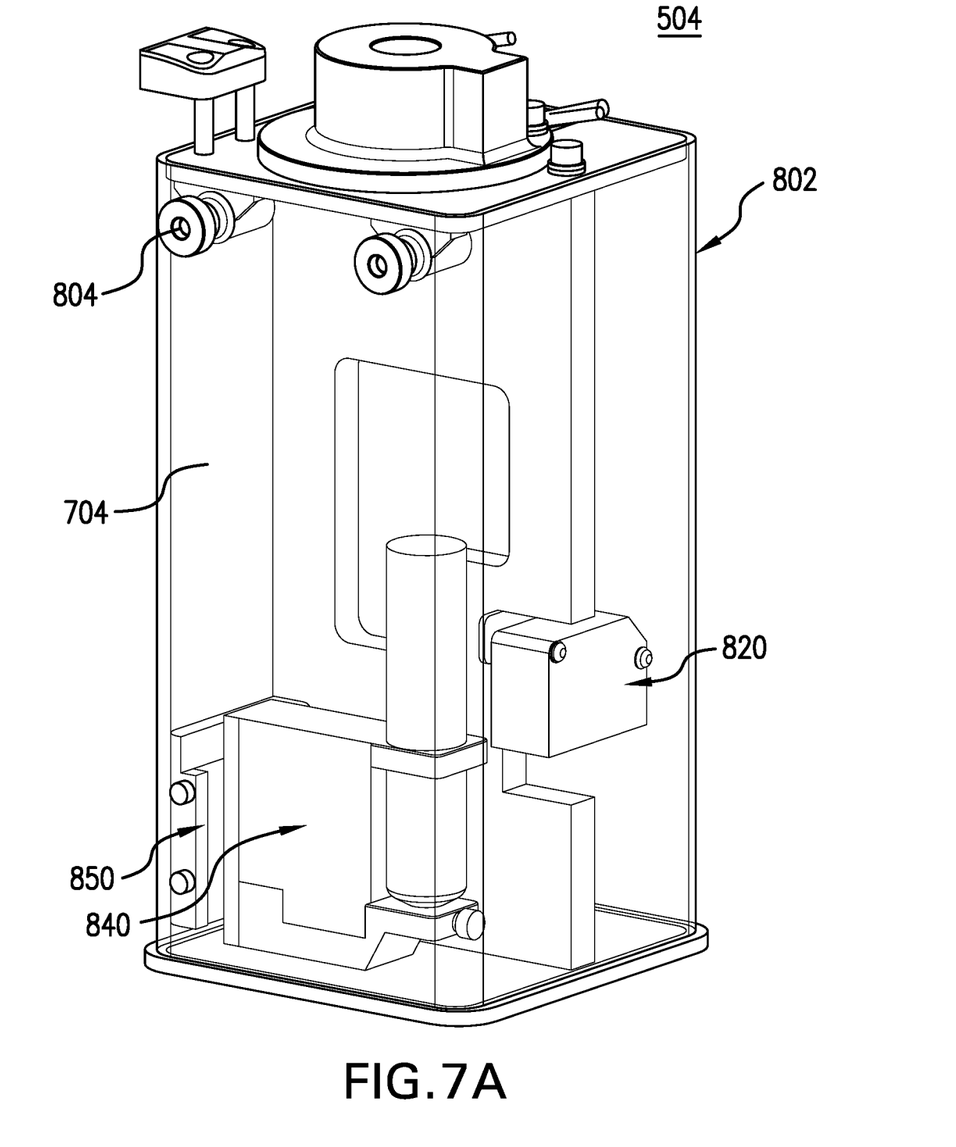
FIG. 7 illustrate underfill dispensers.
Figure 7B:
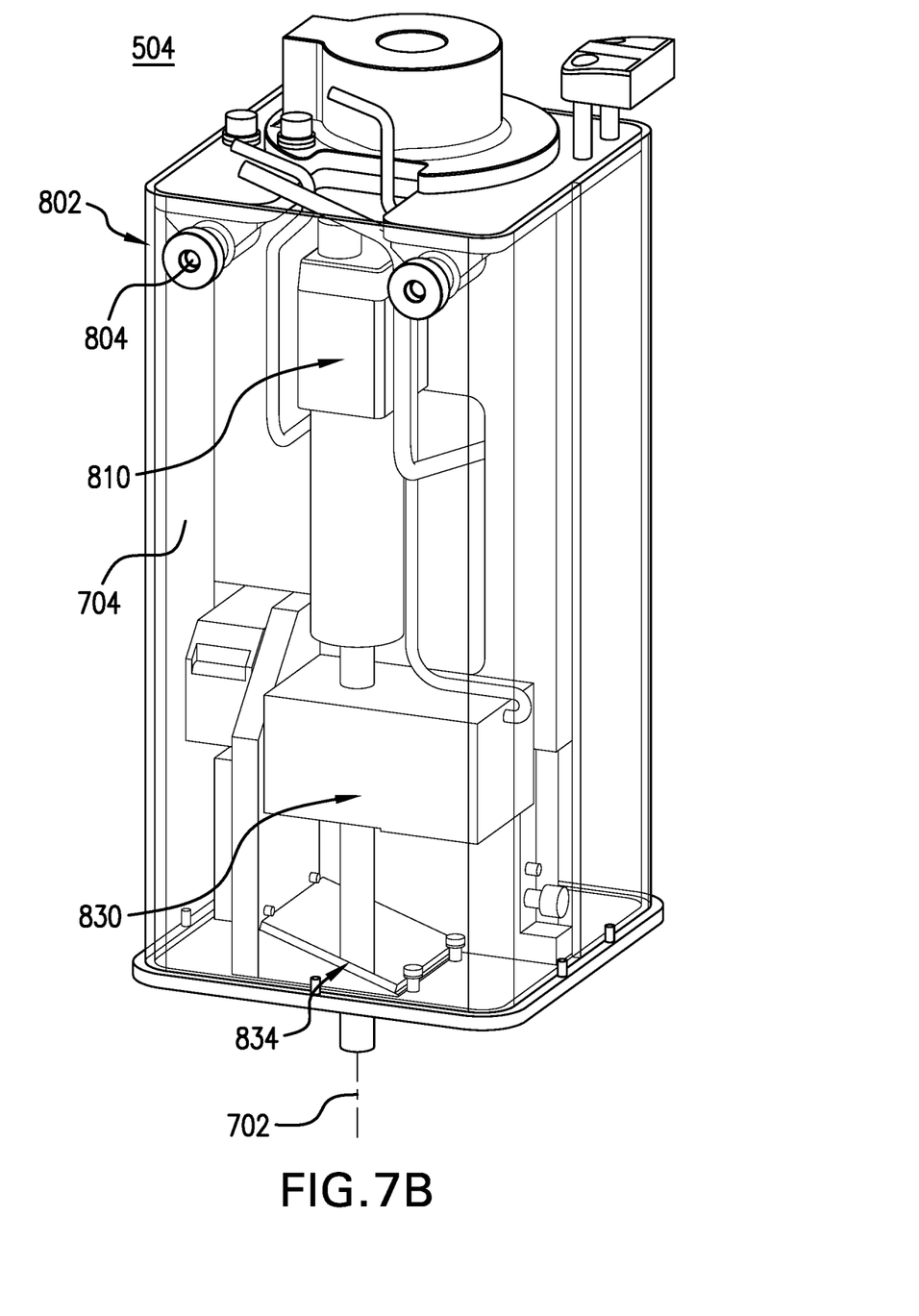

FIGS. 7A and 7B illustrate an exemplary dispensing end effector 504 in accordance with some embodiments. As illustrated, the embodiments may include a heat shield 802 that may, in part, preclude the underfill 702 as-yet undispensed in the dispense head 504 from undesired curing, i.e., crosslinking, due to a heightened temperature within the chamber. Further illustrated in FIG. 7 is an air purge 804 that may be or form part of a cooling and depressurization system for the enclosed dispense head 504. The cooling system may include, by way of example, passive or forced recirculation of air, nitrogen, or the like, using, in part, air purge 804, by way of non-limiting example. Heat shielding 802 and cooling 804 of the dispenser head 504 may prevent the need for variations in underfill processes, such as variations in dispense rates or the useful life of undispensed underfill, which may arise due to an undesirable expedited curing of the underfill while still undispensed from dispense head 504.

Further illustrated in FIG. 7 may be one or more cameras 810 within the end effector enclosure 704. These cameras 810 may allow for calibration, as further discussed herein, underfill dispense process and dispense head 504 operation monitoring, and so on.

FIG. 7 additionally illustrate a laser distance sensor 820, such as may be employed to calibrate the dispense head 504 spatial orientation and/or to periodically, semi-continuously, or continuously monitor the distance from the dispense head 504 to the subject printed circuit board on which the dispensing occurs. Monitoring of the distance from the dispense head 504 to the circuit board allows for enhanced process control, at least in that, to the extent undesirable expedited curing is prevented, underfill dispense rates and locations can be more carefully controlled than in the known art.

FIG. 7 further illustrate lighting 830, such as may be used for additional process monitoring. Also shown is one or more additional heat barriers 834 to prevent the causation of undesirable expedited curing by heat contamination with enclosure 704, and it should be noted that additional heat barriers 834 may be opaque or transparent, such as wherein the one or more additional heat barriers 834 are placed within the path of the laser distance sensor 820, the lighting 830, or the like.

Yet further, it will be apparent that the dispensing end effector 504 may include one or more different types of dispenser 840. The dispenser 840 is the ultimate dispensing point from which the underfill 702 discussed herein is dispensed outwardly from the end effector 504 and onto the circuit board. Of note and as shown, the dispenser 840 and/or the end effector 504 may be modular, and as such may include one or more spring or clip actuated releases 850, whereby actuation of the release 850 may allow for removal and replacement of the dispenser 840.

Figure 8A:
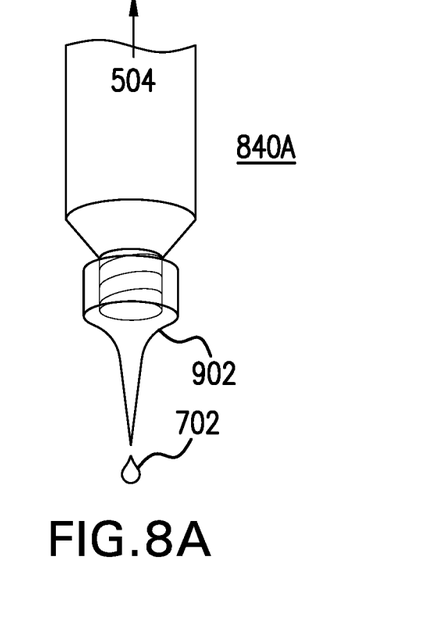
FIG. 8 illustrate underfill dispenser.
Figure 8B:
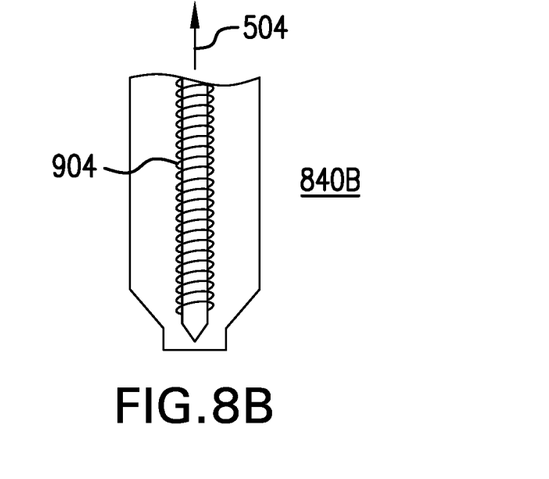
Figure 8C:
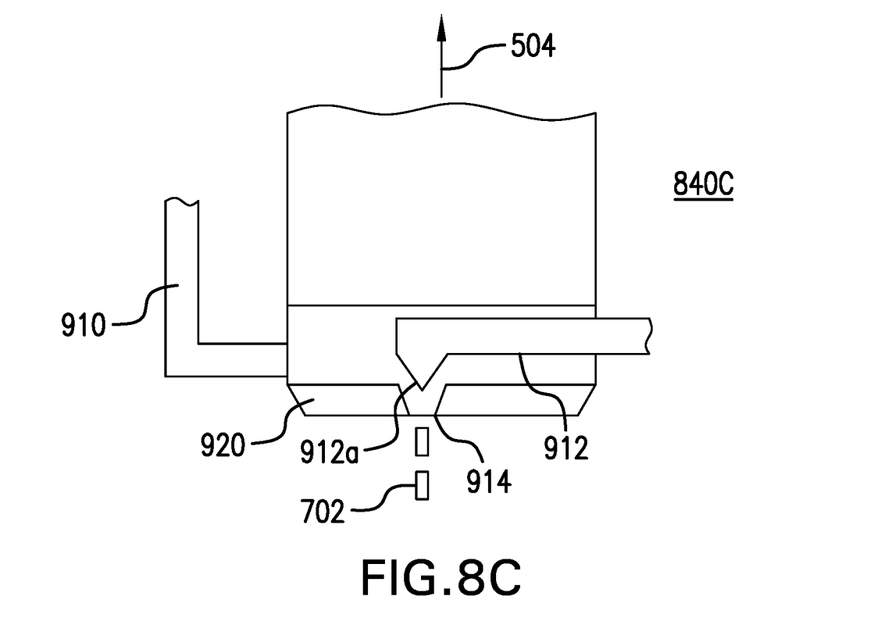

By way of non-limiting example, FIGS. 8A, 8B and 8C illustrate particular different dispensers 840 that may be used in the embodiments. FIG. 8A illustrates a positive pressure needle dispenser 840a, wherein a needle 902 may be threaded, by way of non-limiting example, onto the dispense head 504 to act as a dispenser 840a. The needle 902 may be sized so as to provide a flow rate and droplet size unique to a particular embodiment. Similarly, FIG. 8B illustrates an Archimedes dispenser 840b, in which actuation of an auger 904 may likewise control underfill flow rate and droplet size.

FIG. 8C illustrates a piezo jet dispenser 840c. As illustrated, the piezo jet dispenser 840c includes a material feed 910, and piezo-hammer 912 having an angled tip 912a such that, as the piezo-hammer 912 rises and falls, underfill material 702 from the material feed 910 is forced outward from the dispenser output port 914 onto the circuit board. Thereby, the rise and fall rate of the hammer 912 may be indicative of the dots per second dispensed by the dispenser 840c, and the angle of the angled tip 912a of the piezo-hammer 912, such as in conjunction with the size of the output port 914, may be indicative of the volume of underfill material dispensed per fall of the piezo-hammer 912. In accordance with the foregoing, embodiments may comprise a dispensing of up to 300 drops of underfill per second from the disclosed piezo-jet dispenser 840c.

Also illustrated in FIG. 8C, such as completely or partially surrounding the disclosed output port 914, may be one or more heaters 920. These heaters 920 may be used to maintain the dispensed underfill material 702 at the proper dispensing temperature for which the underfill material readily flows at the desired flow and droplet rate, but does not reach a temperature at which curing of the underfill material 702 begins prior to dispensing. That is, the one or more heaters 920 at the output port 914 may allow for refined temperature control of the dispensed underfill material 702 with a precision unknown in the prior art.

In accordance with the foregoing, a refined size and number of dots per second of underfill dispensing may be achieved in the embodiments. As will be appreciated, this translates to a particular number of millimeters per second of coverage in the X-Y axes to be provided by each dispensing head 504. Accordingly, flow rates may be varied as needed, such for as for number or size of components on a particular circuit board, or dispensed heads 504 may be modularly employed, such as discussed above, wherein a particular dispense head 504 is used for a particular flow rate of size and number of dots per second. Yet further, each such modular dispense head 504 may have its own unique maximum rate and maximum temperature before clogging occurs, and thus these parameters may be matched to the needs of the processing for a particular circuit board on a case-by-case basis.

Figure 9:
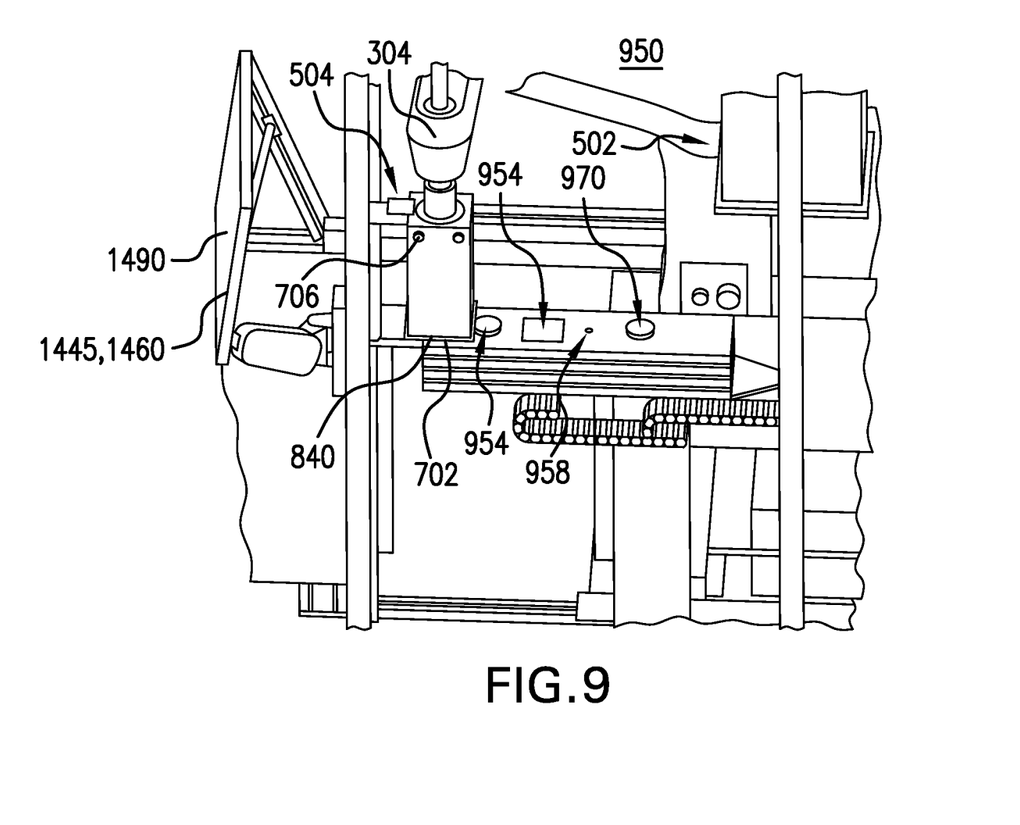
FIG. 9 illustrates an underfill calibration system.

FIG. 9 illustrates an exemplary calibration system 950 for a dispense head/end effector 504 and dispenser 840 in accordance with some embodiments. As illustrated, a dispense head 504 may be at the distal end of an underfill dispensing robot arm 304 from a dispense controller 502 that may operate to control the dispense head 504, as discussed throughout. Further, a calibration system 950 in accordance with the embodiments may include one or more dispense purges 954, at which air may be expressed from the dispense head 504 so as to avoid clogging and/or undesired curing, and further at which unused or clogged material may be purged from the dispense head 504.

Further included in the calibration system 950 may be one or more Z-axis height calibration sensors 958. Such sensors 958 may provide sensing of the height of the dispense head 504 and/or dispense output port 914 from a prospective circuit board, and/or may provide a target location at which the laser height sensor 820 discussed herein as being within the dispense head 504 in some embodiments may assess the propriety of the height sensed above a circuit board.

Further included in an exemplary calibration system 950 may be one or more weighting sensors 970. At a weighting sensor 970, each dispensed dot and/or group of dots from dispenser output port 914 may be sensed. Thereby, dots per second and millimeters of coverage per second for a dispense head 540 may be inferred from the sensing by the weighting sensor. Needless to say, such sensing provides for confirmation of a repeatable flow rate and volume for underfill that matches the desired semiconductor process dictated by recipe 1490 for each circuit board.

In conjunction, the aforementioned calibration aspects may allow for variations in the setup of a dispensing head 504, such as may be entered and/or modified by a user into the user interface and display 1445, 1460 discussed throughout. As such, dispensing processes of recipe 1490 may be calibrated and recalibrated using the disclosed calibration system 950. Of course, sensing of proper calibration may also be performed during "real time" execution of underfill, such as by one or more sensors included within the dispense head 504 as discussed herein throughout.

The operation(s) run on the board discussed throughout may comprise a series of process steps encompassed by a software "recipe" 1490 executed by the processing system 1312. A recipe may be automatically or manually selected, and may execute once the board is associated with the carrier, and/or after the board is entered through the accommodating input. A recipe may consist of a set of defined commands, such as a robot motion, a dispense type, a dispense head temperature, a dispense head distance, a power to a heater, and/or an alignment, by way of example. Commands can be grouped into sub-routines, for example, as will be understood to those skilled in the art.

By way of example, a recipe 1490 may include loading of the board into the accommodating input; bringing the lower heater to a certain temperature once the board is within the chamber, or prior to the board entering the chamber; moving the robots to each position defined in the recipe to dispense underfill based on controlled operation of dispense heads 504; and actuating the chamber heater(s) 320, 322 to a predetermined temperature for any aspect(s) of the board indexed associated therewith. In some embodiments, distinct sub-recipes may be run by each of multiple robots 304 and/or dispense heads 504, in series or in parallel, all running as aspects of the processing system. That is, a series of recipes can be concatenated together into a single recipe, and/or recipes may be parallel or sequenced for proper operation, such as by the processing system and/or a "teaching" mode.

A series of movements, dispense, dispense start and stop, speed and dwell teachings may comprise a discontinuous, semi-continuous, or continuous "path" executed pursuant to a recipe 1490. In embodiments, the paths of multiple robots may necessarily be deconflicted as part of recipe 1490, such as to perform collision avoidance between multiple robots having the capabilities to simultaneously take the same position in three-dimensional space, and/or so as to avoid a "double dispense" of underfill by multiple heads 504.

Figure 10:
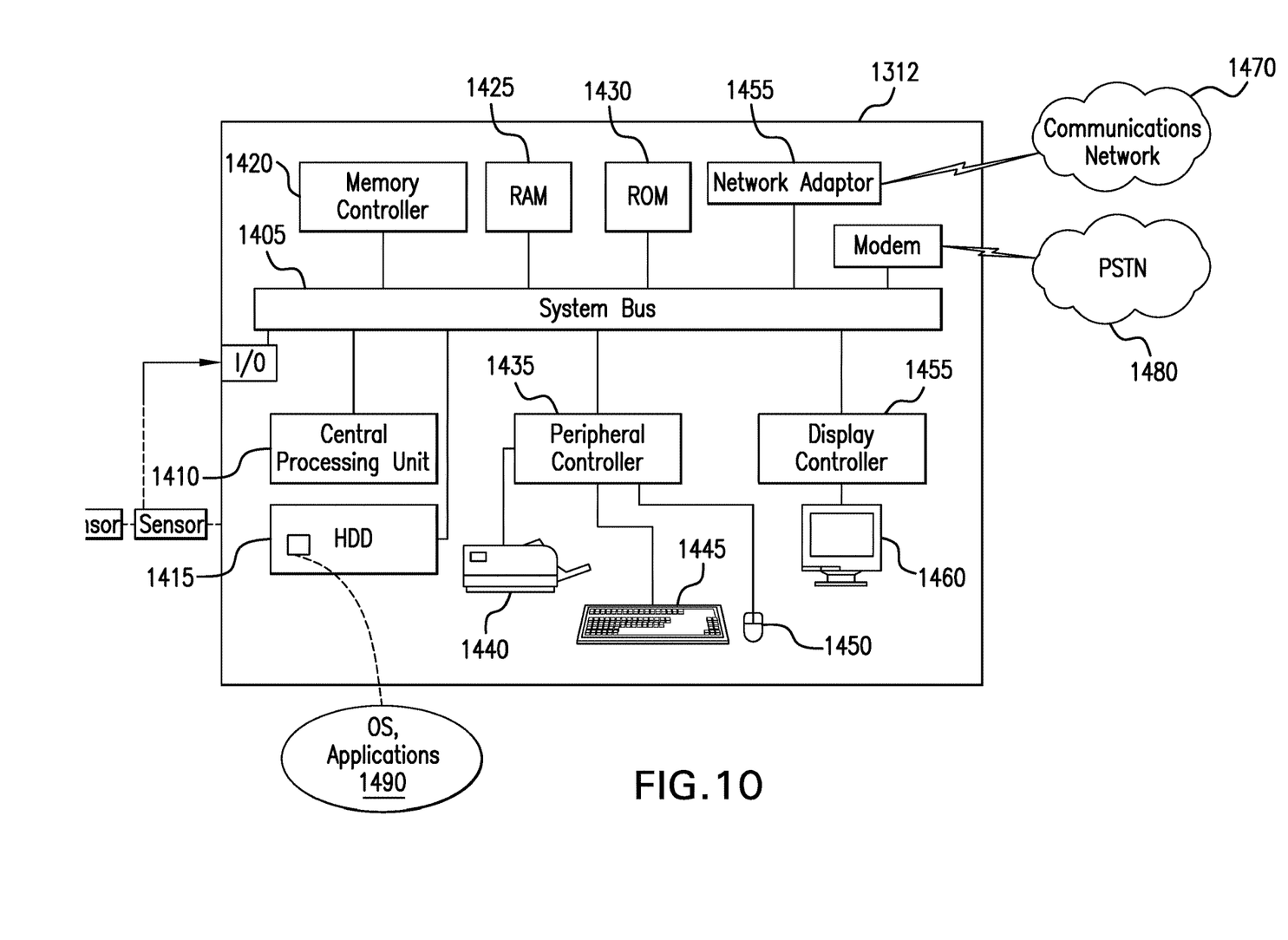
FIG. 10 illustrates an underfill processing system.

FIG. 10 depicts an exemplary computer processing system 1312 for use in association with the embodiments, by way of non-limiting example. Processing system 1312 is capable of executing software, such as an operating system (OS), training applications, user interface, and/or one or more other computing algorithms/applications 1490, such as the recipes discussed herein. The operation of exemplary processing system 1312 is controlled primarily by these computer readable instructions/code 1490, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause system 1312 to perform the disclosed operations, comparisons and calculations. In many known computer servers, workstations, personal computers, and the like, CPU 1410 is implemented in an integrated circuit called a processor.

It is appreciated that, although exemplary processing system 1312 is shown to comprise a single CPU 1410, such description is merely illustrative, as processing system 1312 may comprise a plurality of CPUs 1410. Additionally, system 1312 may exploit the resources of remote CPUs (not shown) through communications network 1470 or some other data communications means 1480, as discussed throughout.

In operation, CPU 1410 fetches, decodes, and executes instructions from a computer readable storage medium, such as HDD 1415. Such instructions may be included in software 1490. Information, such as computer instructions and other computer readable data, is transferred between components of system 1312 via the system's main data-transfer path. The main data-transfer path may use a system bus architecture 1405, although other computer architectures (not shown) can be used.

Memory devices coupled to system bus 1405 may include random access memory (RAM) 1425 and/or read only memory (ROM) 1430, by way of example. Such memories include circuitry that allows information to be stored and retrieved. ROMs 1430 generally contain stored data that cannot be modified. Data stored in RAM 1425 can be read or changed by CPU 1410 or other hardware devices. Access to RAM 1425 and/or ROM 1430 may be controlled by memory controller 1420.

In addition, processing system 1312 may contain peripheral communications controller and bus 1435, which is responsible for communicating instructions from CPU 1410 to, and/or receiving data from, peripherals, such as peripherals 1440, 1445, and 1450, which may include printers, keyboards, and/or the operator interaction elements discussed herein throughout. An example of a peripheral bus is the Peripheral Component Interconnect (PCI) bus that is well known in the pertinent art.

Operator display 1460, which is controlled by display controller 1455, may be used to display visual output and/or presentation data generated by or at the request of processing system 1312, such as responsive to operation of the aforementioned computing programs/applications 1490. Such visual output may include text, graphics, animated graphics, and/or video, for example. Display 1460 may be implemented with a CRT-based video display, an LCD or LED-based display, a gas plasma-based flat-panel display, a touch-panel display, or the like. Display controller 1455 includes electronic components required to generate a video signal that is sent to display 1460.

Further, processing system 1312 may contain network adapter 1465 which may be used to couple to external communication network 1470, which may include or provide access to the Internet, an intranet, an extranet, or the like. Communications network 1470 may provide access for processing system 1312 with means of communicating and transferring software and information electronically. Additionally, communications network 1470 may provide for distributed processing, which involves several computers and the sharing of workloads or cooperative efforts in performing a task, as discussed above. Network adaptor 1465 may communicate to and from network 1470 using any available wired or wireless technologies. Such technologies may include, by way of non-limiting example, cellular, Wi-Fi, Bluetooth, infrared, or the like.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A dispensing end effector suitable for dispensing underfill to components on a printed circuit board within an underfill chamber, comprising:

an electromechanical connection to at least two dispensing robot arms capable of physically situating the dispensing proximate to the circuit board;

a communicative connection to a dispense controller capable of communicatively controlling at least the dispensing;

a dispenser which includes an underfill output port, which is capable of the dispensing, and which is removably mounted to the electromechanical connection, wherein the dispenser comprises a piezo-jet dispenser including a piezo-hammer, wherein the piezo-hammer comprises a cantilevered arm in a horizontal orientation and an angled tip positioned on an underside of the arm proximate to a first end;

wherein the dispenser comprises a material feed proximate to the tip of the piezo-hammer, configured to feed underfill material between the tip of the piezo-hammer and the output port, wherein at least a portion of the material feed is below the arm of the piezo-hammer when the piezo-hammer is in a risen position; and a protective enclosure at least substantially about the dispenser, including at least one calibration camera and at least one monitoring camera.

2. The dispensing end effector of claim 1, wherein the piezo-jet dispenser dispenses the underfill at a rate of between about 100 and about 300 drops per second.

3. The dispensing end effector of claim 1, wherein the angle of the angled tip of the piezo-hammer of the piezo-jet dispenser at least partially dictates a flow rate of the underfill.

4. The dispensing end effector of claim 1, wherein the protective enclosure is substantially sealed.

5. The dispensing end effector of claim 1, wherein the protective enclosure comprises at least heat shielding.

6. The dispensing end effector of claim 5, wherein the heat shielding is opaque.

7. The dispensing end effector of claim 5, wherein the heat shielding is transparent to allow for process monitoring.

8. The dispensing end effector of claim 1, wherein the protective enclosure comprises at least cooling.

9. The dispensing end effector of claim 8, wherein the cooling comprises an air purge.

10. The dispensing end effector of claim 9, wherein the air purge comprises a depressurization for the protective enclosure.

11. The dispensing end effector of claim 8, wherein the cooling comprises one of a forced circulation of air or nitrogen.

12. The dispensing end effector of claim 1, wherein the protective enclosure comprises a laser distance sensor suitable to spatially orient the dispenser.

13. The dispensing end effector of claim 12, wherein the spatial orientation comprises a distance from the dispenser to the circuit board.

14. The dispensing end effector of claim 12, wherein the laser distance sensor is configured to spatially orient the dispenser through a transparent heat barrier.

15. The dispensing end effector of claim 1, wherein the protective enclosure comprises lighting suitable for process monitoring.

16. The dispensing end effector of claim 15, wherein the lighting is configured to illuminate through a transparent heat barrier.

17. The dispensing end effector of claim 1, wherein the dispenser is modular.

18. The dispensing end effector of claim 1, wherein the electromechanical connection is modular.

19. The dispensing end effector of claim 1, wherein the output port comprises a heater.

20. The dispensing end effector of claim 19, wherein the heater is at least substantially about an opening of the output port.

21. The dispensing end effector of claim 1, further comprising a processing system that indexes the dispensing.

22. The dispensing end effector of claim 21, wherein the indexing is for a quadrant of the printed circuit board.

23. The dispensing end effector of claim 1, wherein the dispenser includes one or more spring or clip actuated releases, configured to allow for removal and replacement of the dispenser.

* * * * *